United States Patent
Krishnan et al.

(10) Patent No.: US 6,541,821 B1
(45) Date of Patent: Apr. 1, 2003

(54) SOI DEVICE WITH SOURCE/DRAIN EXTENSIONS AND ADJACENT SHALLOW POCKETS

(75) Inventors: Srinath Krishnan, Campbell, CA (US); Witold P. Maszara, Morgan Hill, CA (US); Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/732,952

(22) Filed: Dec. 7, 2000

(51) Int. Cl.[7] .................................................. H01L 29/72
(52) U.S. Cl. ....................... 257/347; 257/349; 257/369; 257/607
(58) Field of Search ................................ 257/369, 347, 257/349, 607

(56) References Cited

U.S. PATENT DOCUMENTS

| | | | | |
|---|---|---|---|---|
| 6,107,129 A | * | 8/2000 | Gardner et al. | 257/347 |
| 6,124,616 A | * | 9/2000 | Dennison et al. | 257/369 |
| 6,268,640 B1 | * | 7/2001 | Park et al. | 257/607 |
| 6,271,095 B1 | * | 8/2001 | Yu | 257/347 |
| 6,271,132 B1 | | 8/2001 | Xiang et al. | |
| 6,291,278 B1 | | 9/2001 | Xiang et al. | |

* cited by examiner

Primary Examiner—Edward Wojciechowicz

(57) ABSTRACT

A Silicon-on-Insulator (SOI) transistor includes an intrinsic body layer that is fully depleted when in a conductive state. The transistor includes a shallow pocket of dopants adjacent to each of its source and drain regions. The shallow pockets are of a conductivity type opposite to that of the source and drain regions and raise the threshold voltage of the transistor. The transistor also includes a deep pocket of dopants adjacent each of the source and drain regions to suppress the punch-through current.

11 Claims, 6 Drawing Sheets

SOI DEVICE WITH SOURCE/DRAIN EXTENSIONS AND ADJACENT SHALLOW POCKETS

FIELD OF INVENTION

The present invention relates to Silicon-on-Insulator devices and, more particularly, to Silicon-on-Insulator devices having suppressed floating body effects.

BACKGROUND OF THE INVENTION

Integrated Circuits (IC) containing Silicon On Insulator (SOI) devices are becoming increasingly important due to their speed. An SOI device (i.e., transistor) is typically formed in a layer of semiconductor material overlaying an insulating layer formed in a semiconductor substrate.

A prior art SOI transistor such as that shown in FIG. 1 includes a source region 14 and a drain region 14 which are separated from each other by a channel region 12. A gate 15 is separated from the device by a gate oxide layer 13. Both the source and drain regions are of the same conductivity type opposite to that of the body region 16. For example, when the body region is of a p-type material, the source and drain regions are of n-type materials. The source and drain regions typically have a higher dopant concentration level than the body region.

There are two known types of SOI transistors, namely partially depleted SOI transistor and fully depleted SOI transistor.

In a partially depleted SOI transistor, such as the known SOI transistor 10 of FIG. 1, when channel 12 is formed between source/drain regions 14, depletion region 16 extends only partially into body layer 18. Unlike a conventional MOS transistor, a typical SOI transistor, such as SOI transistor 10, does not have a body contact. In other words, body layer 18 of SOI 10 floats. Consequently, when a DC current flows between the source and drain regions 14, holes generated due to impact ionization, thermal effects or gate-induced drain leakage, flow to the floating body layer 18 thereby affecting its potential and causing its threshold voltage to change (i.e., due to the transistor body effect). Similarly, when the gate or source/drain voltage is modulated (i.e. during transient events), the potential at body layer 18 is changed, which modulates the SOI threshold voltage.

In a fully depleted SOI, such as the known SOI 20 of FIG. 2, the width of body layer 22 overlaying insulating layer 24 is smaller than the width of the depletion region that extends into body layer 18 when channel 12 is formed. Therefore, the potential at body layer 18 remains fixed. Accordingly, the threshold voltage of SOI transistor 20 remains unchanged and is not subject to the body effect.

Although SOI 20 does not suffer from threshold voltage variations due to body effect, it is difficult to controllably manufacture a thin body layer 22 that fully depletes when channel 12 is formed.

Therefore, a need continues to exists for an SOI device which has a suppressed body-effect and which can be controllably manufactured.

SUMMARY OF THE INVENTION

A Silicon-on-Insulator (SOI) transistor, in accordance with one embodiment of the present invention, includes an intrinsic body layer in which source and drain regions are formed; a shallow p-type pocket adjacent the source region and a shallow p-type pocket adjacent the drain region. The shallow p-type pockets increase the threshold voltage of the SOI device. Because the body layer is lightly doped, it is fully depleted when the device channel is formed. Some embodiments of the present invention include two deep p-type pockets. The first deep p-type pocket is adjacent the source and its neighboring shallow p-type pocket. The second deep p-type pocket is adjacent the drain and its neighboring shallow p-type pocket. The deep p-type pockets suppress the punch-through current.

DETAILED DESCRIPTION

Figure 1:
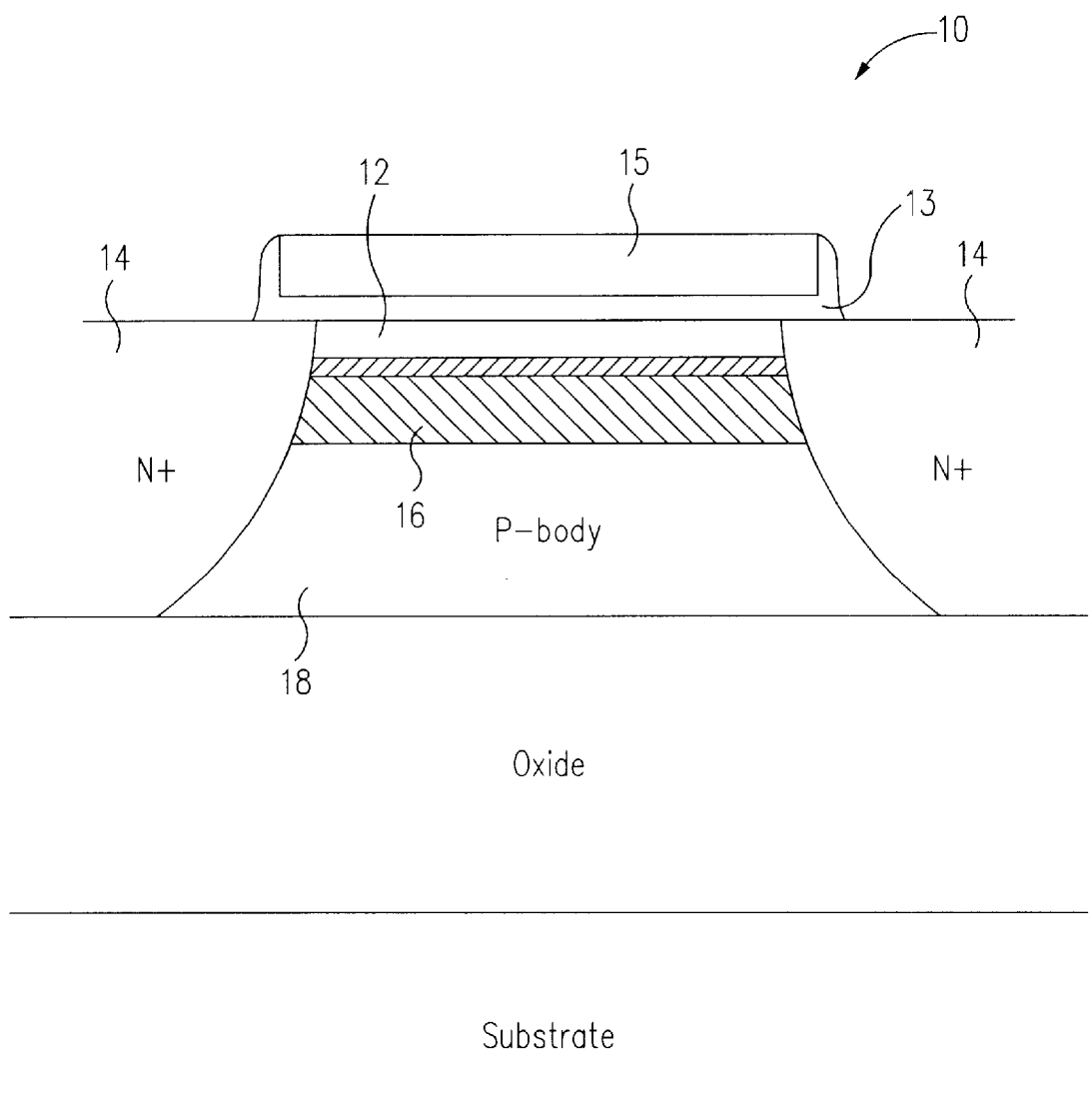
FIG. 1 shows a cross-section of a partially depleted SOI transistor, as known in the prior art.
Figure 2:
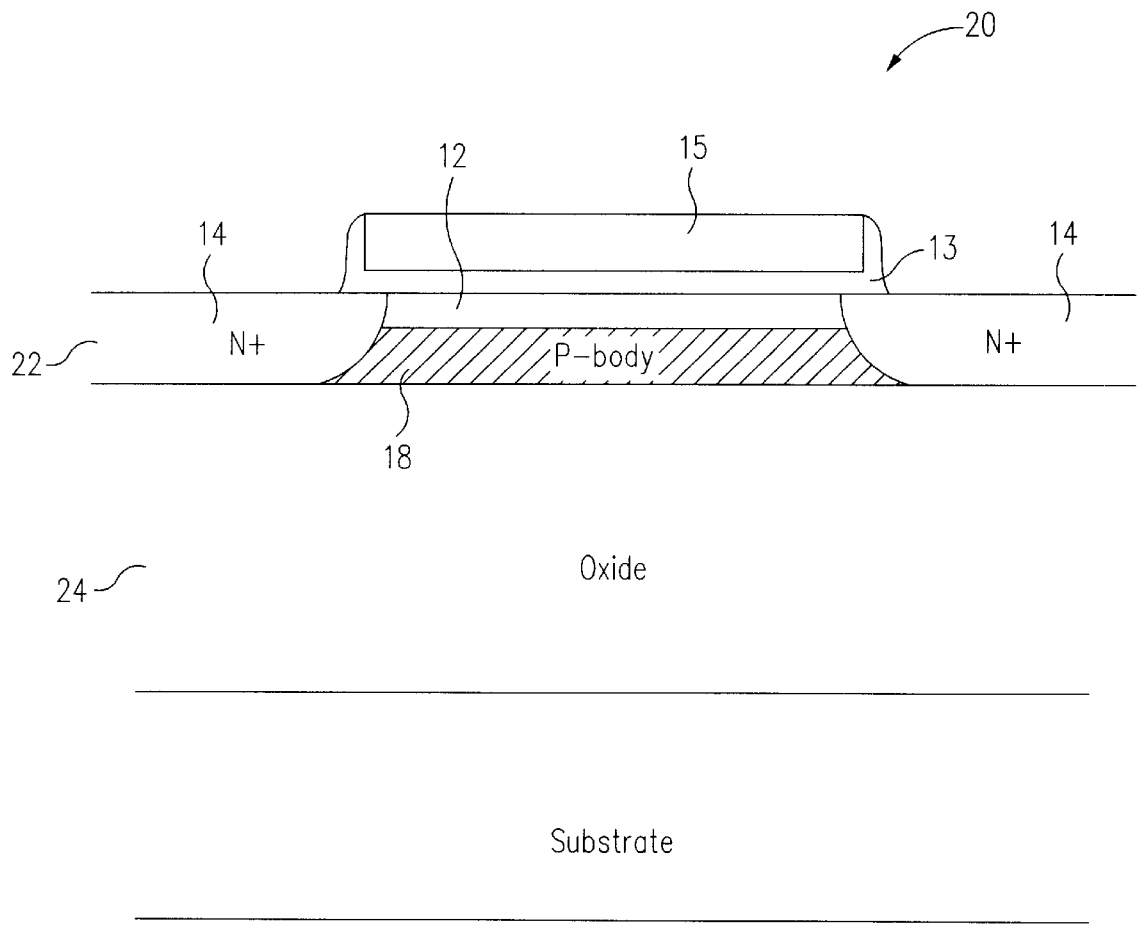
FIG. 2 shows a cross-section of a fully depleted SOI transistor, as known in the prior art.
Figure 3:
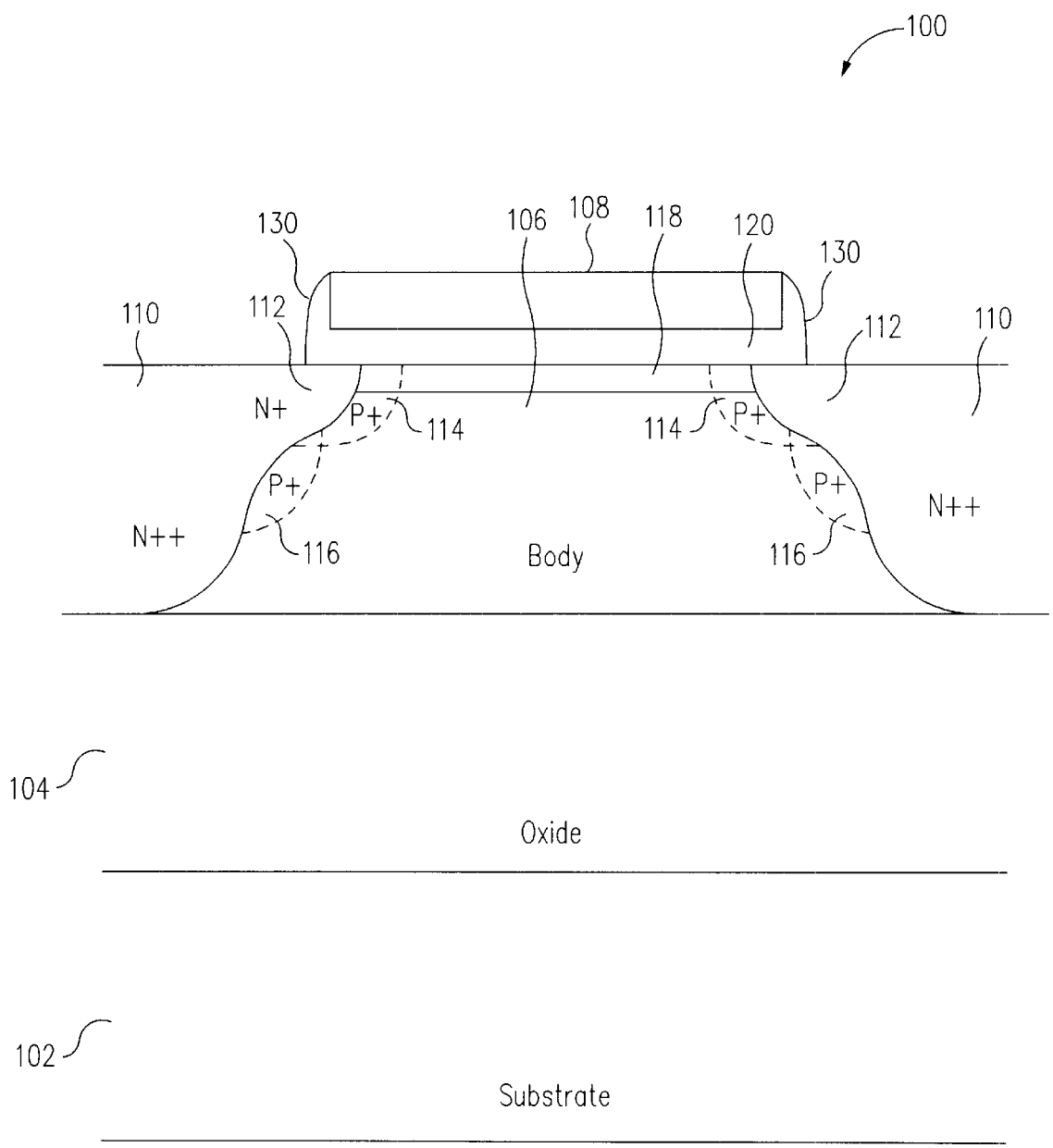
FIG. 3 shows a SOI device, in accordance with one embodiment of the present invention.

A hybrid Silicon-on-Insulator (SOI) transistor 100, in accordance with one embodiment of the present invention, is shown in FIG. 3. SOI 100 is formed in body layer 106, which is formed over insulating layer 104. Semiconductor substrate layer 102 underlays oxide layer 104.

Body layer 106 is an intrinsic silicon layer in which the transistor source/drain regions are formed. Gate 108 is separated from body 106 by gate oxide layer 120. Body layer 106 may have a thickness varying from 0.1 $\mu$m to 0.2 $\mu$m and has a silicon atom concentration of $10^{15}$ cm$^{-3}$. Because of the low silicon concentration of body layer 106, when SOI 100 is in a conductive state (i.e., when channel 118 is formed) a depletion layer (not shown) having a width of approximately 1 $\mu$m extends into body layer 106. Consequently, because the depletion layer width is greater than the width of body layer 106, body layer 106 becomes fully depleted of mobile carriers (i.e., electrons and holes) when SOI 100 is in a conductive state.

Because body layer 106 is fully depleted when SOI 100 is in a conductive state, the potential of body layer 106 remains unchanged and, accordingly, the threshold voltage of SOI transistor 100 remains fixed. In other words, SOI transistor 100 has a suppressed body effect, even though it has a floating body (i.e., body layer 106 does not have a contact.)

To compensate for the low concentration of silicon atoms in intrinsic body layer 106 and to thereby increase its threshold voltage, SOI transistor 100 includes two shallow p$^+$ pockets 114. Each of the shallow p$^+$ pockets 114 are of p-type conductivity and each is adjacent to either the drain or the source region of SOI 100.

To suppress the punch-through current, SOI transistor 100 includes two deep p$^+$ pockets 116 which are of p-type conductivity. Each of deep p$^+$ pockets 116 is adjacent to either the drain or the source region of SOI 100, as seen in FIG. 3.

Each of the source and drain regions includes an N$^{++}$ region 110 and an N$^+$ region 112. N$^{++}$ regions 110 have a very high n-type dopant concentration. N⁺ regions 112—whose dopant concentration are less than those of N⁺⁺ regions 110—extend the n-type N⁺⁺ regions 110 under gate 108, thereby ensuring that channel 118 connects the source and drain region when SOI 100 is in a conductive state.

In some embodiments of the present invention, the concentration of the various regions of SOI 100 is as follows. N⁺⁺ regions 110 each have a very high n-type dopant (e.g., Phosphorous) concentration of, for example, $10^{20}$ cm$^{-3}$. N⁺ regions 112 each have a dopant concentration of, for example, $5 \times 10^{19}$ cm$^{-3}$. Each of deep p⁺ pockets 114 or shallow p⁺ pockets 116 has a p-type (e.g., boron) dopant concentration of approximately $10^{18}$ cm$^{-3}$.

A method of making hybrid SOI transistor 100, in accordance with one embodiment of the present invention, is described below.

Figure 4:
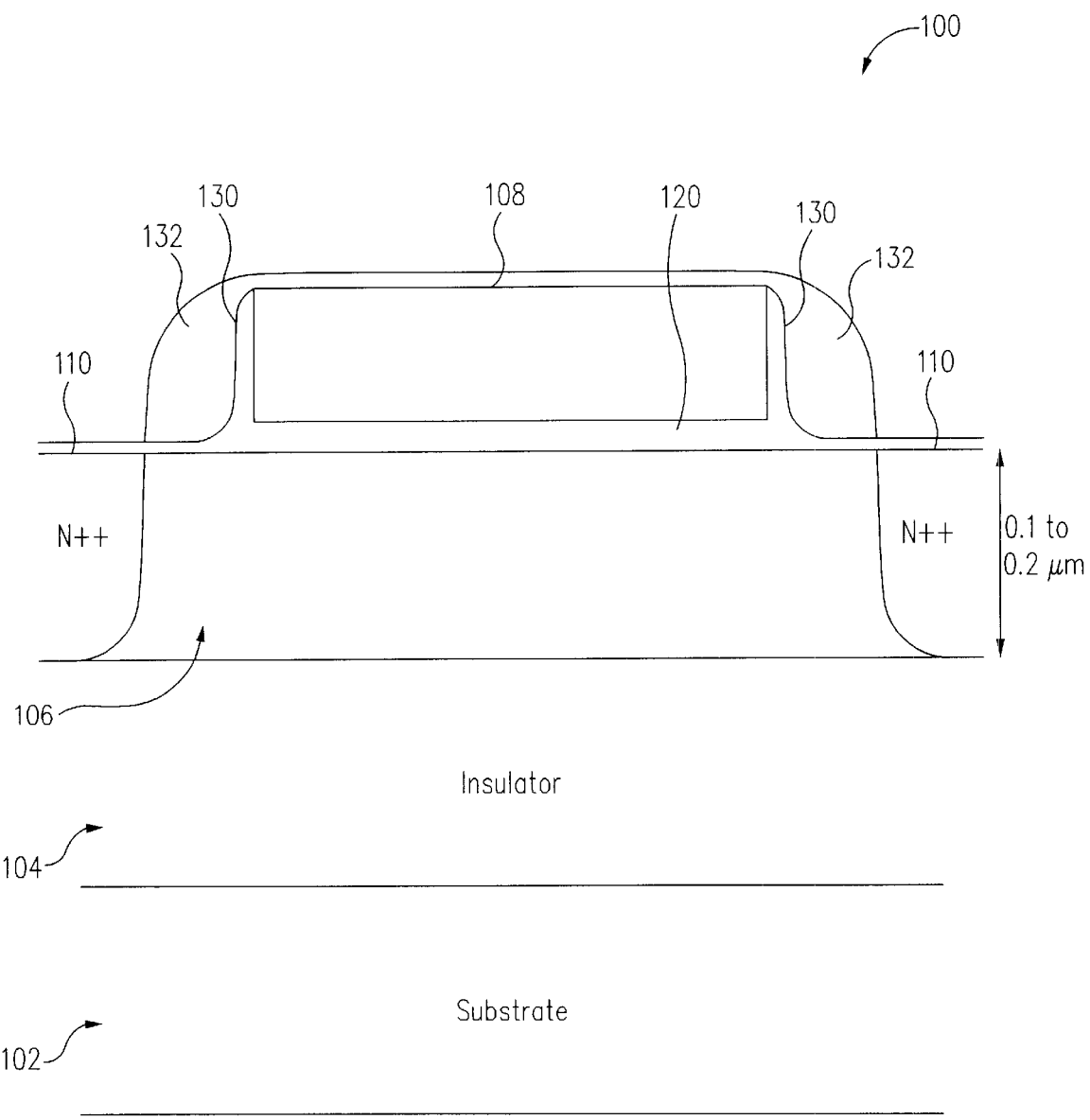
FIG. 4 shows a SOI transistor, in accordance with one embodiment of the present invention, after performing source/drain implants.

Referring to FIG. 4, SOI transistor 100 is formed in a starting SOI material which includes substrate layer 102, insulator layer 104 and body layer 106. As stated above, body layer 106 may be an intrinsic silicon layer or may receive a threshold adjust implant so as to contain, for example, $10^{15}$ cm$^{-3}$ of p-type dopants.

Next, gate oxide layer 120 is grown over body layer 106. Subsequently a layer of polysilicon is deposited over the surface of the gate oxide 120. The polysilicon layer may be pre-doped with a high concentration of n-type dopants after deposition.

Subsequently, the polysilicon layer is patterned using conventional masking and etching steps thereby forming polysilicon gate 108, shown in FIG. 4. As an alternative to pre-doping, polysilicon 108 may be doped with a high concentration of n-type dopants after it is so formed.

Next, using conventional processing steps, oxide liner 130 and nitride spacers 132 are formed, as shown in FIG. 4.

Thereafter, a source/drain implant followed by a rapid thermal anneal is carried out to form N⁺⁺ source/drain regions 110 in body layer 106.

Subsequently, the resulting structure is immersed in hot phosphoric acid to remove nitride spacers 132. Then, an oxide etch is performed to remove the oxide liner above the surface of gate 108. The resulting structure after these two etching steps is shown in FIG. 5.

Figure 5:
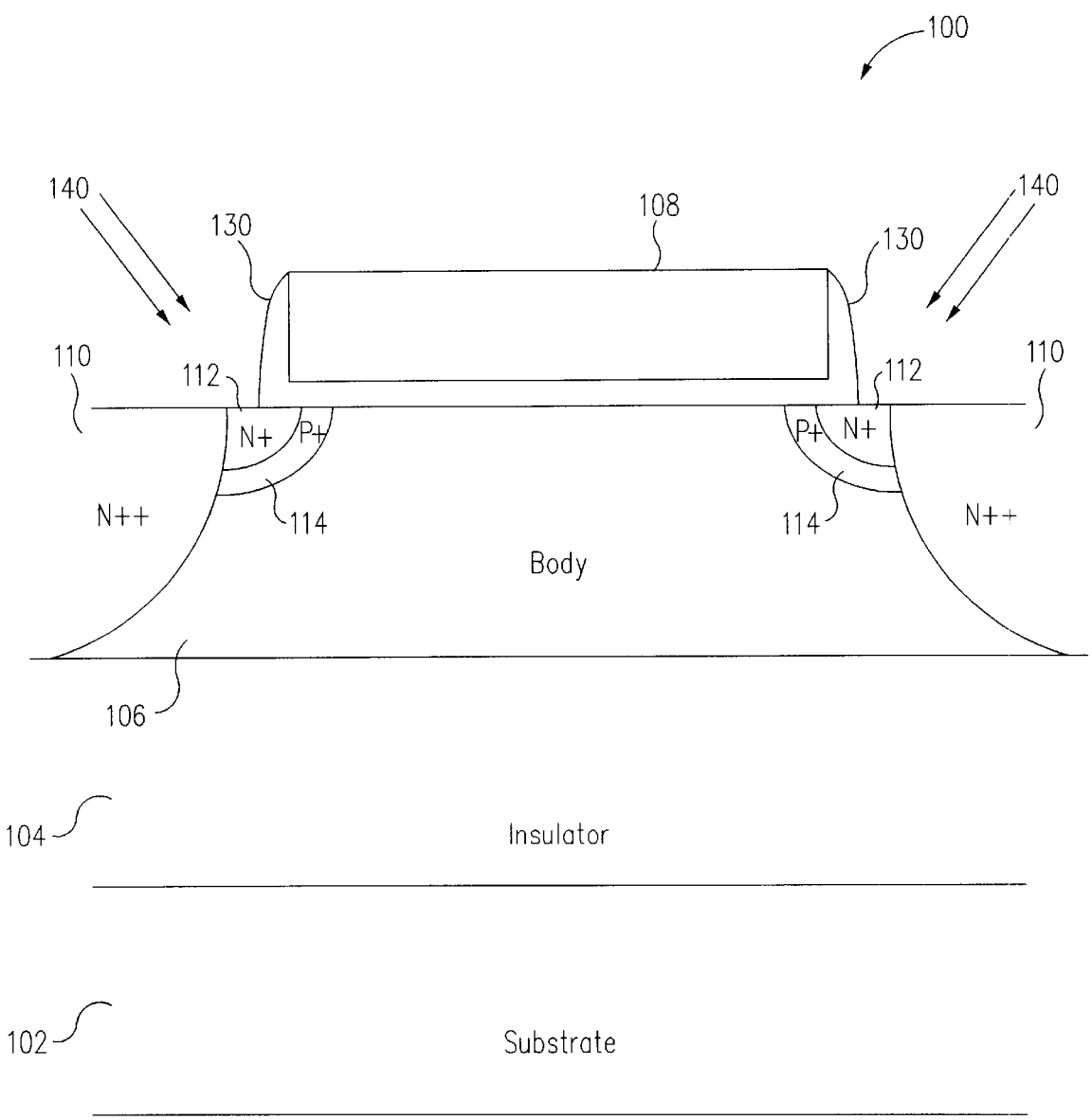
FIG. 5 shows the SOI transistor of FIG. 4 after performing the first p-type halo implant.

Next, as shown in FIG. 5, a source/drain extension implant is performed to form source/drain extension regions 112. Subsequently, a halo p-type implant is performed. In one embodiment, the halo p-type implant is performed at a 45° angle along the direction of arrows 140. The 45° angle halo p-type implant forms p-type regions 114 in body layer 106 adjacent source/drain extension regions 112.

Figure 6:
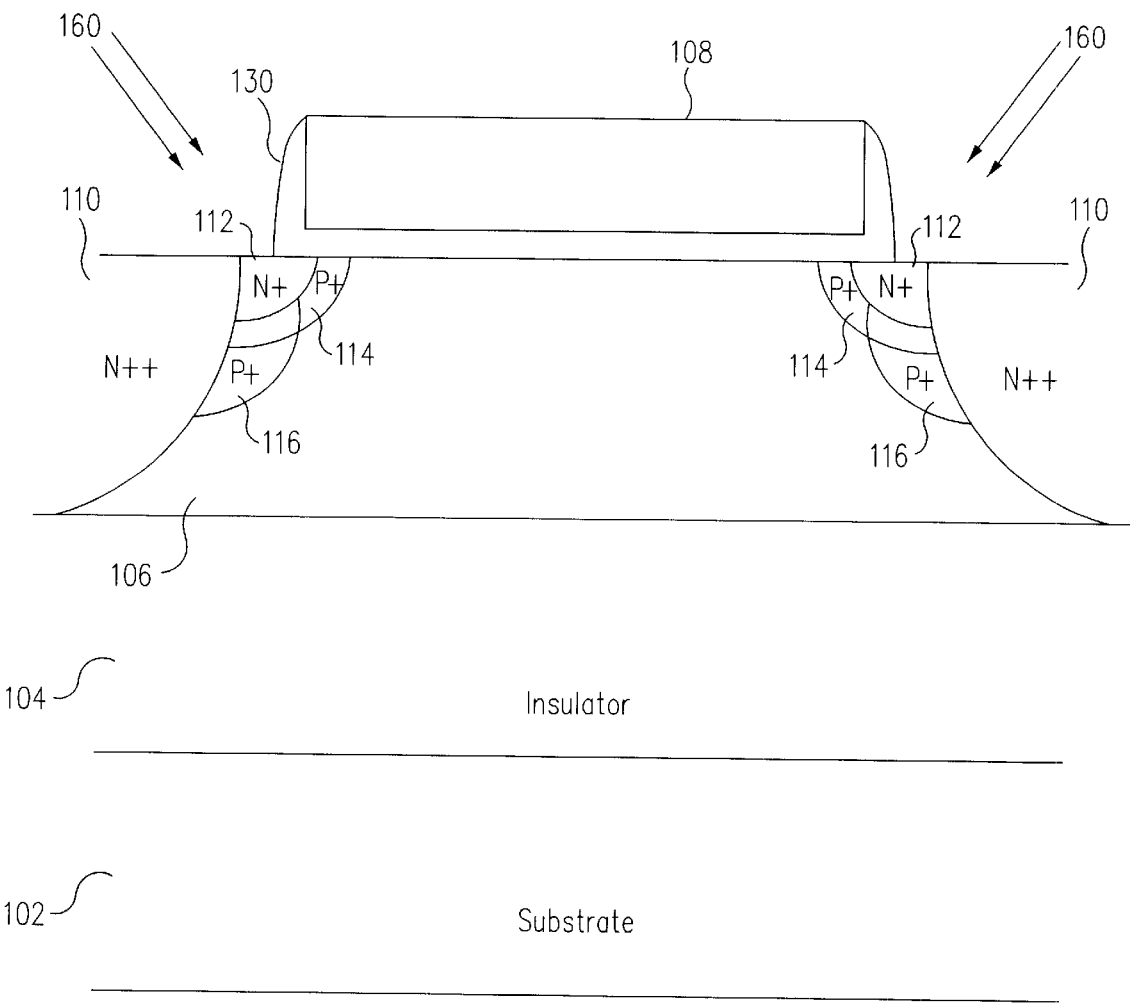
FIG. 6 shows the SOI transistor of FIG. 5 after performing the second p-type halo implant.

Next, as shown in FIG. 6, an additional halo p-type implant is performed along the direction of arrows 160. In one embodiment, the additional halo p-type implant is performed at an angle between 15° and 30°. The halo p-type implant forms p regions 116 in body layer 106, as shown in FIG. 6.

Subsequently a rapid thermal anneal is performed to activate the impurities implanted during the source/drain extension implant and the two p-type implants.

Alternatively, to achieve greater control of the diffusion of implanted impurities, two rapid thermal anneals may be performed; once after the source/drain extension implant, and once after the second p-type halo implant.

Because of the low silicon concentration of body layer 106, when SOI 100 is in a conductive state, body layer 106 becomes fully depleted of mobile carriers (i.e., electrons and holes). In other words, when in a conductive state, the depletion region (not shown) reaches the interface of body layer 106 and insulator layer 104. Therefore, SOI transistor 100 has a suppressed body effect as its threshold voltage does not vary.

P⁺ regions 114 adjust the threshold voltage of SOI transistor 100, while p⁺ regions 116 suppress the punch-through current.

The exemplary embodiments of the invention disclosed above are illustrative and not limiting. Other embodiments of this invention are possible within the scope of the appended claims. The invention is not limited by the type or the concentration of the dopants that form the various regions of the device. The invention is not limited by the semiconductor material which forms the body layer.

We claim:

1. A silicon-on-insulator (SOI) transistor comprising:
   a body layer;
   a source and a drain region formed in the body layer and each being of a first conductivity type; and
   a pair of shallow pockets of a second conductivity type formed in the body layer, wherein the pair of shallow pockets of a second conductivity comprise a first shallow pocket adjacent the source region and a second shallow pocket adjacent the drain region, wherein the first and second shallow pockets are respectively in direct contact with the source region and drain region and the shallow pockets extend into the body region to substantially less depth than do the source and drain regions.

2. The SOI transistor of claim 1, wherein each of said source and drain regions include a first region and a second region each being of the first conductivity type, wherein a dopant concentration of the first region of each of the source and drain regions is greater than a dopant concentration of the second region of each of the source and drain regions.

3. The SOI transistor of claim 1, wherein said pair of shallow pockets are doped such that said body layer is fully depleted when said SOI is in a conductive state.

4. The SOI transistor of claim 1 wherein the pair of shallow pockets are doped to increase the threshold voltage of the SOI transistor.

5. The SOI transistor of claim 1 wherein the body layer is an intrinsic silicon layer.

6. The SOI transistor of claim 1 further comprising a pair of deep pockets of a second conductivity type formed in the body region.

7. The SOI transistor of claim 6 wherein the pair of deep pockets comprises a first deep pocket and a second deep pocket, the first deep pocket being adjacent to one of the pair of shallow pockets, the second deep pocket being adjacent the other of the pair of shallow pockets.

8. The SOI transistor of claim 6 wherein the pair of deep pockets are doped to suppress a punch-through current of the SOI transistor.

9. The SOI transistor of claim 1 wherein said body layer does not include a contact.

10. The SOI transistor of claim 1 wherein the first conductivity type is n type and the second conductivity type is p type.

11. The SOI transistor of claim 1 wherein a thickness of a depletion layer of the SOI transistor is greater than a thickness of the body layer when the SOI transistor is in a conductive state.

* * * * *